(12) United States Patent
Kim

(10) Patent No.: US 11,646,294 B2
(45) Date of Patent: May 9, 2023

(54) METHOD OF MANUFACTURING A SEMICONDUCTOR PACKAGE AND APPARATUS FOR PERFORMING THE SAME

(71) Applicant: SAMSUNG ELECTRONICS CO., LTD., Suwon-si (KR)

(72) Inventor: Ungkeol Kim, Cheonan-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 111 days.

(21) Appl. No.: 17/218,581

(22) Filed: Mar. 31, 2021

(65) Prior Publication Data

US 2022/0068874 A1    Mar. 3, 2022

(30) Foreign Application Priority Data

Sep. 1, 2020 (KR) .................. 10-2020-0110978

(51) Int. Cl.
*H01L 23/00* (2006.01)

(52) U.S. Cl.
CPC .............. *H01L 24/83* (2013.01); *H01L 24/75* (2013.01); *H01L 2224/75251* (2013.01); *H01L 2224/75252* (2013.01); *H01L 2224/75611* (2013.01); *H01L 2224/75802* (2013.01); *H01L 2224/83862* (2013.01); *H01L 2924/3511* (2013.01)

(58) Field of Classification Search
CPC ........... H01L 24/83; H01L 2224/83862; H01L 2924/3511; H01L 24/75
See application file for complete search history.

(56) References Cited

U.S. PATENT DOCUMENTS

| 7,215,008 B2 | 5/2007 | Kim et al. |
| 9,738,014 B2 | 8/2017 | Maeyama et al. |
| 2012/0322174 A1* | 12/2012 | Byun ............... H01L 24/94 438/15 |

FOREIGN PATENT DOCUMENTS

| JP | 5716227 B2 | 7/2012 |
| KR | 10-0676314 B1 | 1/2007 |
| KR | 10-0810472 B1 | 3/2008 |
| KR | 10-0816647 B1 | 3/2008 |
| KR | 10-0851243 B1 | 8/2008 |
| KR | 10-1459101 B1 | 11/2014 |

* cited by examiner

*Primary Examiner* — Dale E Page
*Assistant Examiner* — Wilner Jean Baptiste
(74) *Attorney, Agent, or Firm* — Lee IP Law, P.C.

(57) ABSTRACT

In a method of manufacturing a semiconductor package, information with respect to a downward warpage of a reference package substrate, which may be bent with respect to a long axis and/or a short axis of the reference package substrate in applying heat to the reference package substrate to which a plurality of semiconductor chips may be attached using a die attach film (DAF), may be obtained. A package substrate, which may include a first surface to which the semiconductor chips may be attached using the DAF and a second surface opposite to the first surface, may be rotated with respect to the long axis or the short axis at an angle selected based on the information. The heat may be applied to the package substrate to cure the DAF and correct a warpage of the package substrate. Thus, warpage of the package substrate may be corrected for.

15 Claims, 12 Drawing Sheets

US 11,646,294 B2

METHOD OF MANUFACTURING A SEMICONDUCTOR PACKAGE AND APPARATUS FOR PERFORMING THE SAME

Korean Patent Application No. 10-2020-0110978, filed on Sep. 1, 2020, in the Korean Intellectual Property Office, and entitled: "Method of Manufacturing a Semiconductor Package and Apparatus for Performing the Same," is incorporated by reference herein in its entirety.

BACKGROUND

1. Field

Embodiments relate to a method of manufacturing a semiconductor package and an apparatus for performing the same.

2. Description of the Related Art

Generally, a plurality of semiconductor chips may be attached to a package substrate using a die attach film (DAF). The package substrate with the semiconductor chips may be loaded into a curing chamber to cure the DAF.

SUMMARY

Embodiments are directed to a method of manufacturing a semiconductor package, the method including: obtaining first warpage information with respect to a first downward warpage of a reference package substrate centering on a long axis and/or a short axis of the reference package substrate in a curing process of applying heat to the reference package substrate to cure a first die attach film thereon, wherein the reference package substrate has a first plurality of semiconductor chips attached to the reference package substrate using the first die attach film; rotating a package substrate, which includes a first surface and a second surface opposite to the first surface, with respect to a long axis and/or a short axis of the package substrate at an angle of about 180° selected based on the first warpage information, wherein the package substrate has a second plurality of semiconductor chips attached to the package substrate using a second die attach film, the second plurality of semiconductor chips and the second die attach film being on the first surface of the package substrate; and applying heat to the package substrate to cure the second die attach film while correcting for a warpage of the package substrate.

Embodiments are also directed to a method of manufacturing a semiconductor package, the method including: obtaining first warpage information with respect to a warpage of a reference package substrate in a curing process of applying heat to the reference package substrate to cure a first die attach film thereon, wherein the reference package substrate has a first plurality of semiconductor chips attached to the reference package substrate using the first die attach film; rotating a package substrate, which includes a first surface and a second surface opposite to the first surface, at an angle selected based on the first warpage information, wherein the package substrate has a second plurality of semiconductor chips attached to the package substrate using a second die attach film, the second plurality of semiconductor chips and the second die attach film being on the first surface of the package substrate; and applying the heat to the package substrate to cure the second die attach film while correcting for a warpage of the package substrate.

Embodiments are also directed to an apparatus for manufacturing a semiconductor package, the apparatus including: a controller configured to store first warpage information with respect to a warpage of a reference package substrate in a process of applying heat to the reference package substrate to curing a first die attach film thereon, wherein the reference package substrate has a first plurality of semiconductor chips attached to the reference package substrate using the first die attach film; a curing chamber configured to apply heat to a package substrate, which includes a first surface and a second surface opposite to the first surface, wherein the package substrate has a second plurality of semiconductor chips attached to the package substrate using a second die attach film, the second plurality of semiconductor chips and the second die attach film being on the first surface of the package substrate, the second die attach film being cured in the curing chamber; and an actuator configured to rotate the package substrate at an angle selected based on the first warpage information.

BRIEF DESCRIPTION OF THE DRAWINGS

Features will become apparent to those of skill in the art by describing in detail example embodiments with reference to the attached drawings in which.

DETAILED DESCRIPTION

Figure 1:
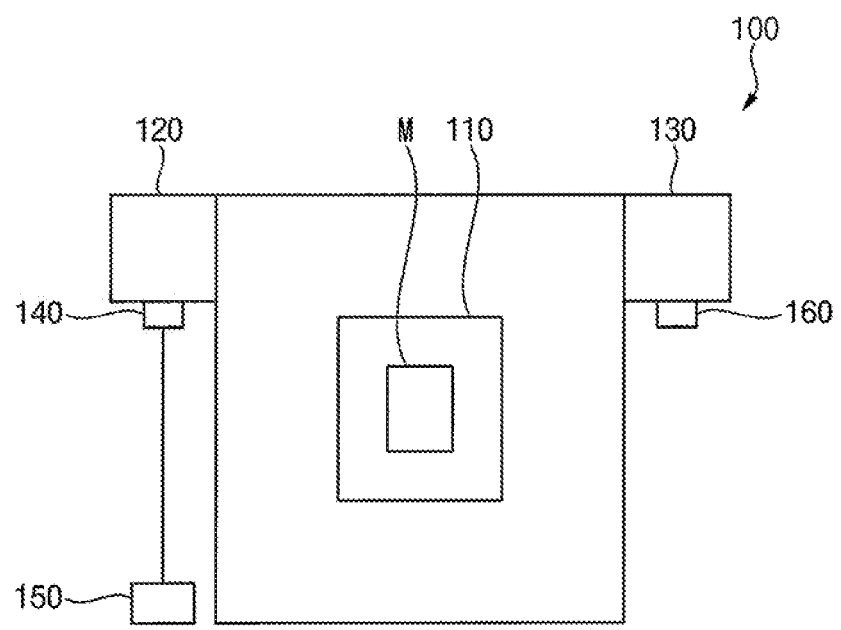
FIG. 1 is a plan view illustrating an apparatus for manufacturing a semiconductor package according to an example embodiment.
Figure 2:
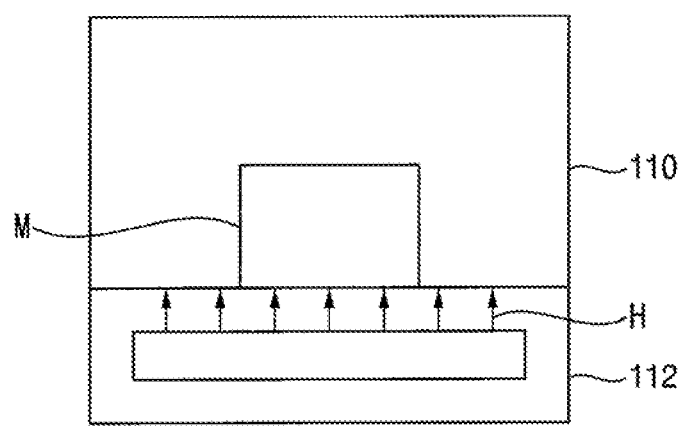
FIG. 2 is a cross-sectional view illustrating an internal structure of a curing chamber in the apparatus of FIG. 1.
Figure 3:
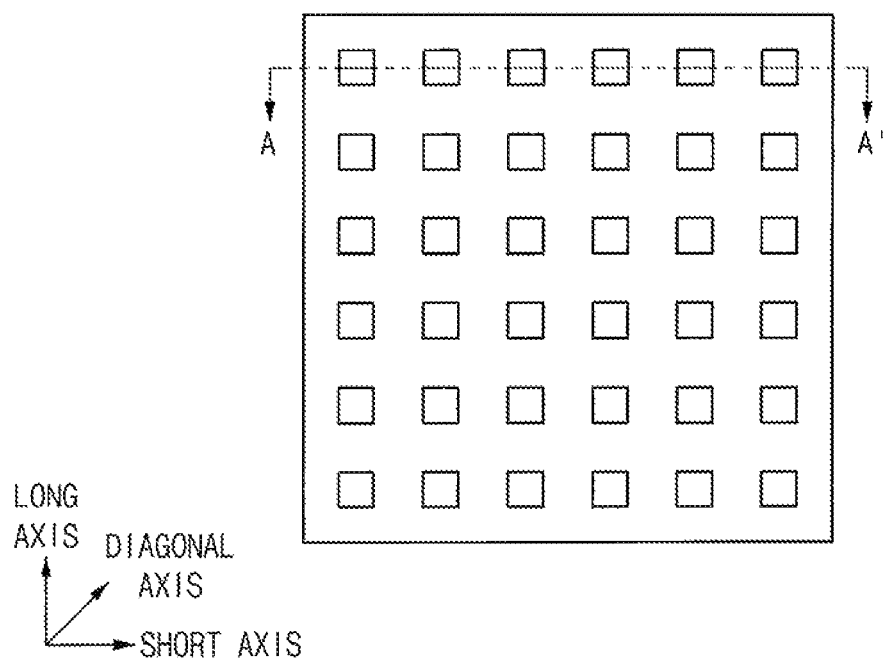
FIG. 3 is a plan view illustrating a package substrate loaded into the curing chamber in FIG. 2.
Figure 4:
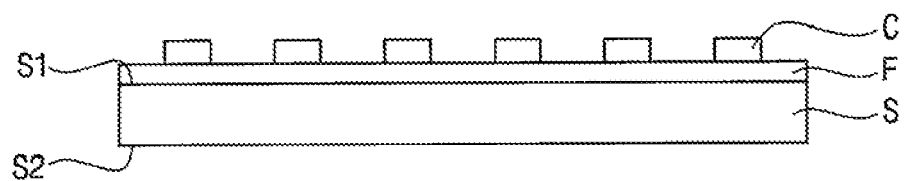
FIG. 4 is a cross-sectional view taken along a line A-A' in FIG. 3.

FIG. 1 is a plan view illustrating an apparatus for manufacturing a semiconductor package according to an example embodiment, FIG. 2 is a cross-sectional view illustrating an internal structure of a curing chamber in the apparatus of FIG. 1, FIG. 3 is a plan view illustrating a package substrate loaded into the curing chamber in FIG. 2, and FIG. 4 is a cross-sectional view taken along a line A-A' in FIG. 3.

Referring to FIGS. 1-4, an apparatus 100 for manufacturing a semiconductor package according to an example embodiment may include an apparatus for curing a die attach film (DAF) F interposed between semiconductor chips C and a package substrate S to attach the semiconductor chips C to the package substrate S.

The package substrate S may include a first surface S1 and a second surface S2 opposite to the first surface S1. The first surface S1 may correspond to an upper surface of the package substrate S. The second surface S2 may correspond to a lower surface of the package substrate S. The DAF F may be arranged on the first surface S1 of the package substrate S. The semiconductor chips C may be attached to the first surface S1 of the package substrate S using the DAF F.

Referring again to FIGS. 1 and 2, the apparatus 100 may include a curing chamber 110, a loader 120, an unloader 130, a first actuator 140, a second actuator 160, and a controller 150.

The loader 120 may load the package substrate S into the curing chamber 110. The package substrate S may include the semiconductor chips C attached to the package substrate S using the DAF F. The loader 120 may load the package substrate S with the first surface S1 being upwardly oriented into the curing chamber 110. In another implementation, the loader 120 may load a magazine M configured to receive one or more package substrates S into the curing chamber 110. The package substrates S may be received in the magazine M with the first surface S1 being upwardly oriented.

The curing chamber 110 may include a heater 112. The heater 112 may be placed at a lower region or an upper region in the curing chamber 110. In an example embodiment, the heater 112 may be positioned at the lower region of the curing chamber 110. Thus, a heat generated from the heater 112 may be transferred from the lower region to the upper region in the curing chamber 110. The heat may be applied to the package substrates M in the magazine M to cure the DAFs F on the package substrates S. Thus, an applying direction H of the heat to the package substrate S may be an upward direction. In contrast, when the heater 112 is positioned at the upper region of the curing chamber 110, the applying direction H of the heat may be downward direction.

Referring again to FIG. 3, in the curing process, the heat may be applied to the second surface S2 of the package substrate S. Thus, after the curing process, the package substrate S in the curing chamber 110 having a high temperature may be bent due to a weight of the package substrate S. For example, a warpage may be generated at the package substrates S due to weights of the semiconductor chips C. Further, a warpage may be generated at the package substrate S due to the process for attaching the semiconductor chips C to the first surface S1 of the package substrate S. The warpage of the package substrate S may be generated with respect to a long axis, a short axis, and/or a diagonal axis of the package substrate S. For example, the warpage of the package substrate S may be generated due to the weights of the semiconductor chips C and/or the weight of the package substrate S. Further, when the package substrate S is located at a position at which the heat is directly applied, the warpage of the package substrate S may be generated by the heat.

The controller 150 may obtain information with respect to a warpage of a reference package substrate RS after the curing process. The reference package substrate RS may have a structure substantially the same as that of the package substrate S. That is, the reference package substrates RS may include a first surface RS1 and a second surface RS2 opposite to the first surface RS1. The DAF F may be arranged on the first surface RS1 of the reference package substrate RS. The semiconductor chips C may be attached to the first surface RS1 of the reference package substrate RS using the DAF F. The semiconductor chips C on the reference package substrate RS may have an arrangement substantially the same as that of the semiconductor chips C on the package substrate S.

The curing process may be performed on the reference package substrate RS using the apparatus in FIG. 1. After the curing process, a warpage may be generated in the reference package substrate RS with respect to a long axis, a short axis, and/or a diagonal axis of the reference package substrate RS. Because the arrangement of the semiconductor chips C on the reference package substrate RS may be substantially the same as the arrangement of the semiconductor chip C on the package substrate S, the warpage of the reference package substrate RS may represent the warpage of the package substrate S.

Information with respect to the warpage of the reference package substrate RS may be stored in the controller 150. For example, the information of the warpage with respect to the long axis of the reference package substrate RS, the short axis of the reference package substrate RS, and/or the diagonal axis of the package substrate RS may be stored in the controller 150. Further, information of the warpage of the reference package substrate RS generated in attaching the semiconductor chips C to the reference package substrate RS may also be stored in the controller 150.

In another implementation, the controller 150 may store information with respect to warpages of a plurality of reference package substrates RS. The semiconductor chips C on the reference package substrates RS may have different arrangements. Thus, the controller 150 may store the various information with respect to the warpages of the reference package substrates RS having different structures. Therefore, the controller 150 may select, from among the stored information, information corresponding to a structure substantially the same as that of the package substrate S to actually be cured.

Figure 5:
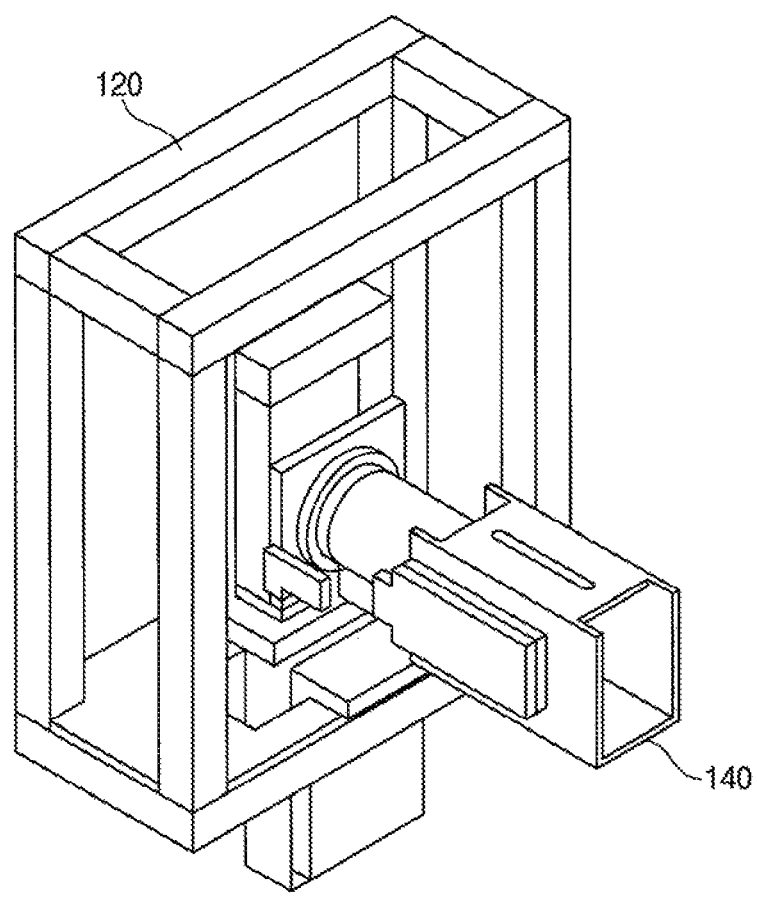
FIG. 5 is a perspective view illustrating a first actuator arranged in a loading region of the apparatus in FIG. 1.

FIG. 5 is a perspective view illustrating a first actuator arranged in a loading region of the apparatus in FIG. 1.

Referring to FIGS. 1 and 5, the first actuator 140 may be arranged in the loader 120. The first actuator 140 may be configured to rotate the package substrate S based on the information stored in the controller 150. That is, before loading the package substrate S into the curing chamber 110, the first actuator 140 may rotate the package substrate S. Thus, the loader 120 may load the rotated package substrate S into the curing chamber 110. In an example embodiment, the first actuator 140 may include a motor, a cylinder, etc.

A rotation angle of the package substrate S by the first actuator 140 may be determined according to the information stored in the controller 150. That is, the rotation angle of the package substrate S by the first actuator 140 may be determined according to the information with respect to the warpage of the reference package substrate RS, which may have a structure substantially the same as that of the package substrate S to be actually cured, among the information stored in the controller 150.

As an example, when the reference package substrate RS having the structure, which may be substantially the same as that of the package substrate S, may be downwardly bent with respect to the long axis or the short axis (see FIG. 9) after the curing process, the actual package substrate S may also be downwardly bent with respect to the long axis or the short axis after the curing process. The first actuator 140 may rotate the package substrate S at an angle of about 180° with respect to the long axis or the short axis before the curing process, such that the first surface S1 of the package substrate S may be downwardly oriented and the second surface S2 of the package substrate S may be upwardly oriented.

The loader 120 may load the package substrate S rotated at the angle of about 180° into the curing chamber 110. The heat generated from the heater 112 may be applied to the first surface S1 of the package substrate S. As a result, a downward deflection of the package substrate S rotated at an angle of about 180° caused by the weight of the package substrate S may be suppressed to correct the warpage of the package substrate S with respect to the long axis or the short axis.

In another example, when the reference package substrate RS having the structure, which may be substantially the same as that of the package substrate S, may be upwardly bent with respect to the diagonal axis after the curing process, the actual package substrate S may also be upwardly bent with respect to the diagonal axis after the curing process. The first actuator 140 may rotate the package substrate S at an acute angle with respect to the diagonal axis before the curing process, such that the slanted second surface S2 of the package substrate S may be downwardly oriented and the slanted first surface S1 of the package substrate S may be upwardly oriented. The acute angle may be determined according to the information stored in the controller 150.

The loader 120 may load the package substrate S rotated at the acute angle into the curing chamber 110. The heat generated from the heater 112 may be applied to the slanted second surface S2 of the package substrate S. As a result, a downward deflection of the package substrate S rotated at the acute angle caused by the weight of the package substrate S may be suppressed to correct the upward warpage of the package substrate S with respect to the diagonal axis.

As another example, when the reference package substrate RS having the structure, which may be substantially the same as that of the package substrate S, may be downwardly bent with respect to the diagonal axis after the curing process, the actual package substrate S may also be downwardly bent with respect to the diagonal axis after the curing process. The first actuator 140 may rotate the package substrate S at an obtuse angle with respect to the diagonal axis before the curing process, such that the slanted first surface S1 of the package substrate S may be downwardly oriented and the slanted second surface S2 of the package substrate S may be upwardly oriented. The obtuse angle may be determined according to the information stored in the controller 150.

The loader 120 may load the package substrate S rotated at the obtuse angle into the curing chamber 110. The heat generated from the heater 112 may be applied to the slanted first surface S1 of the package substrate S. As a result, a downward deflection of the package substrate S rotated at the obtuse angle caused by the weight of the package substrate S may be suppressed to correct the downward warpage of the package substrate S with respect to the diagonal axis.

As another example, in order to reduce an influence of the package substrate S caused by the heat from the heater 112, the first actuator 140 may rotate the package substrate S at an angle of about 90° before the curing process, such that the first surface S1 and the second surface S2 of the package substrate S may be substantially parallel to the applying direction H of the heat.

The loader 120 may load the package substrate S rotated at the angle of about 90° into the curing chamber 110. The heat generated from the heater 112 may not be directly applied to the first surface S1 and the second surface S2 of the package substrate S. As a result, a deflection of the package substrate S rotated at an angle of about 90° caused by the weight of the package substrate S may be suppressed so that the warpage of the package substrate S may also be suppressed.

The unloader 130 may unload the cured package substrate S from the curing chamber 110. The unloaded package substrate S may be in the rotated state by the first actuator 140.

The second actuator 160 may reversely rotate the rotated package substrate S to return the package substrate S to the original position. The second actuator 160 may include a motor, a cylinder, etc.

Figure 6:
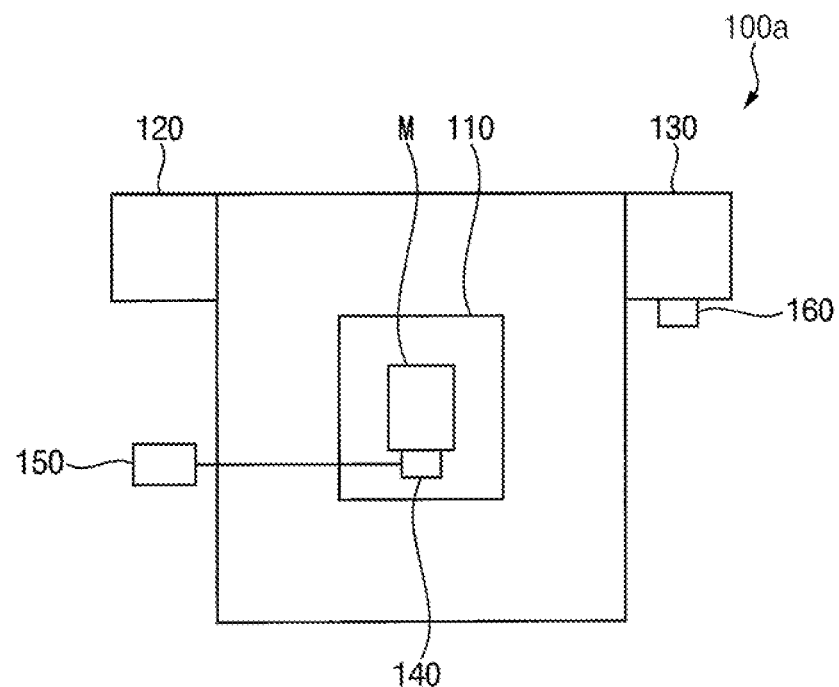
FIG. 6 is a plan view illustrating an apparatus for manufacturing a semiconductor package according to an example embodiment.

FIG. 6 is a plan view illustrating an apparatus for manufacturing a semiconductor package according to an example embodiment.

An apparatus 100a for manufacturing a semiconductor package according to this example embodiment may include elements substantially the same as those of the apparatus 100 in FIG. 1 except for the position of the first actuator 140. Thus, the same reference numerals may refer to the same elements and any further illustrations with respect to the same elements may be omitted herein for brevity.

Referring to FIG. 6, the first actuator 140 may be arranged in the curing chamber 110. The first actuator 140 may rotate the magazine M loaded into the curing chamber 110 at an angle selected based on the information in the controller 150. Thus, the package substrate S in the magazine Z may also be rotated at an angle substantially the same as the rotated angle of the magazine Z.

Figure 7:
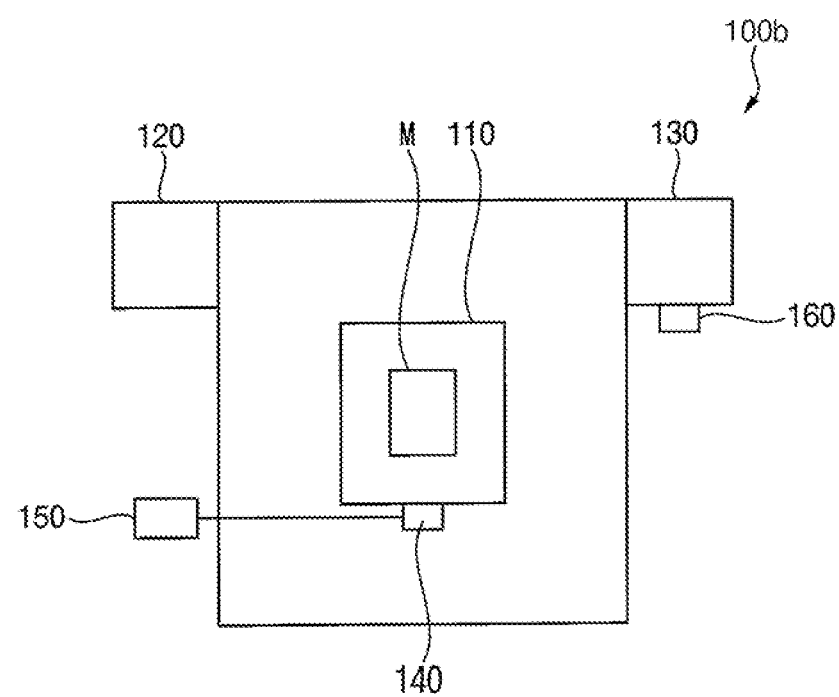
FIG. 7 is a plan view illustrating an apparatus for manufacturing a semiconductor package according to an example embodiment.

FIG. 7 is a plan view illustrating an apparatus for manufacturing a semiconductor package according to an example embodiment.

An apparatus 100b for manufacturing a semiconductor package according to this example embodiment may include elements substantially the same as those of the apparatus 100 in FIG. 1 except for the position of the first actuator 140. Thus, the same reference numerals may refer to the same elements and any further illustrations with respect to the same elements may be omitted herein for brevity.

Referring to FIG. 7, the first actuator 140 may be connected to an outer surface of the curing chamber 110. The first actuator 140 may rotate the magazine M loaded into the curing chamber 110 at an angle selected based on the information in the controller 150. Thus, the package substrate S in the magazine Z may also be rotated at an angle substantially the same as the rotated angle of the magazine Z.

Figure 8:
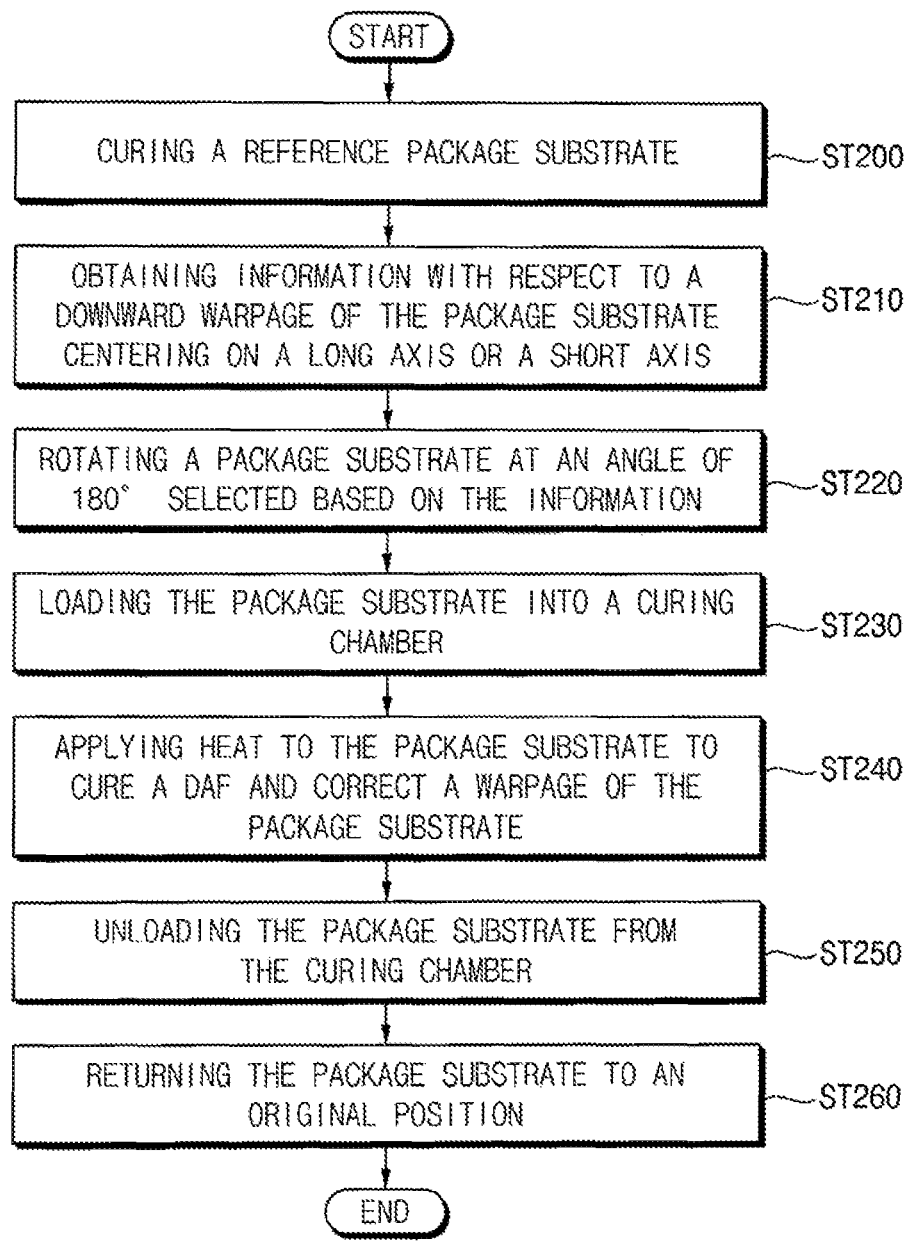
FIG. 8 is a flow chart illustrating a method of manufacturing a semiconductor package using the apparatus in FIG. 1 according to an example embodiment.
Figure 9:
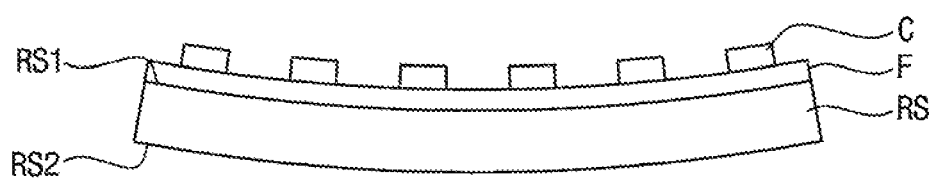
FIG. 9 is a cross-sectional view illustrating a downward warpage of a reference package substrate after a curing process.
Figure 10:
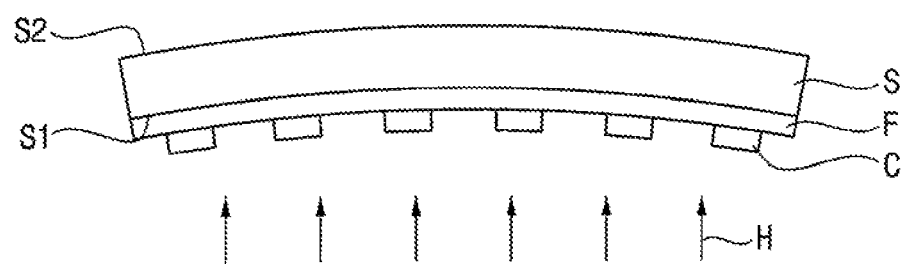
FIG. 10 is a cross-sectional view illustrating a package substrate rotated by an actuator at an angle of 180°.

FIG. 8 is a flow chart illustrating a method of manufacturing a semiconductor package using the apparatus in FIG. 1 according to an example embodiment, FIG. 9 is a cross-sectional view illustrating a downward warpage of a reference package substrate after a curing process, and FIG. 10 is a cross-sectional view illustrating a package substrate rotated by an actuator at an angle of 180°.

Referring to FIGS. 1 and 8, in operation ST200, the reference package substrate RS may be cured using the apparatus 100 in FIG. 1.

After the curing process, as shown in FIG. 9, the reference package substrate RS may be downwardly bent with respect to the long axis or the short axis of the reference package substrate RS.

In operation ST210, the controller 150 may obtain the information of the downward warpage of the reference package substrate RS with respect to the long axis or the short axis. The information may include, e.g., a value indicating an amount of warpage such as a distance measurement of warpage of an edge of the reference package substrate RS relative to a middle of the reference package substrate RS. The information may then be stored in the controller 150.

In operation ST220, as shown in FIG. 10, the first actuator 140 may rotate the package substrate S, which may have a structure substantially the same as that of the reference package substrate RS, at an angle of about 180° based on the information in the controller 150 with respect to the warpage of the reference package substrate RS. Thus, the first surface S1 of the package substrate S may be downwardly oriented and the second surface S2 of the package substrate S may be upwardly oriented.

In operation ST230, the loader 120 may load the package substrate S rotated at the angle of about 180° into the curing chamber 110.

In operation ST240, the heater 112 may apply the heat to the first surface S1 of the package substrate S to cure the DAF F. In the curing process, the downward deflection of the package substrate S may be suppressed due to the rotation thereof at the angle of about 180° to thus prevent the warpage of the package substrate S with respect to the long axis or the short axis.

In operation ST250, after the DAF F is cured, the unloader 130 may unload the package substrate S from the curing chamber 110. The unloaded package substrate S may be in the rotated state at the angle of about 180° by the first actuator 140.

In operation ST260, the second actuator 160 may reversely rotate the package substrate at the angle of about 180° to return the package substrate S to the original position.

In another implementation, the method of an example embodiment may use the apparatus 100a in FIG. 6 or the apparatus 100b in FIG. 7.

Figure 11:
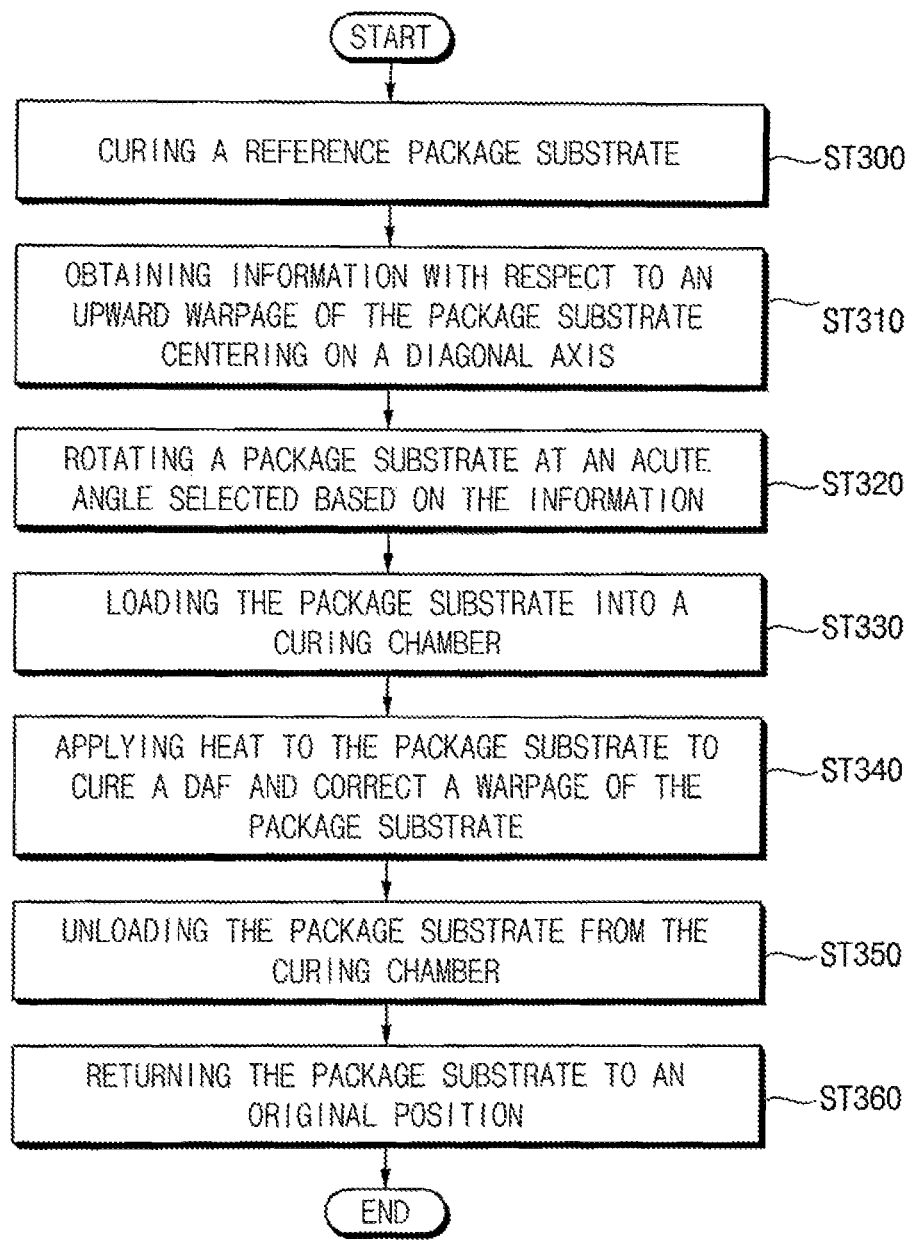
FIG. 11 is a flow chart illustrating a method of manufacturing a semiconductor package using the apparatus in FIG. 1 according to an example embodiment.
Figure 12:
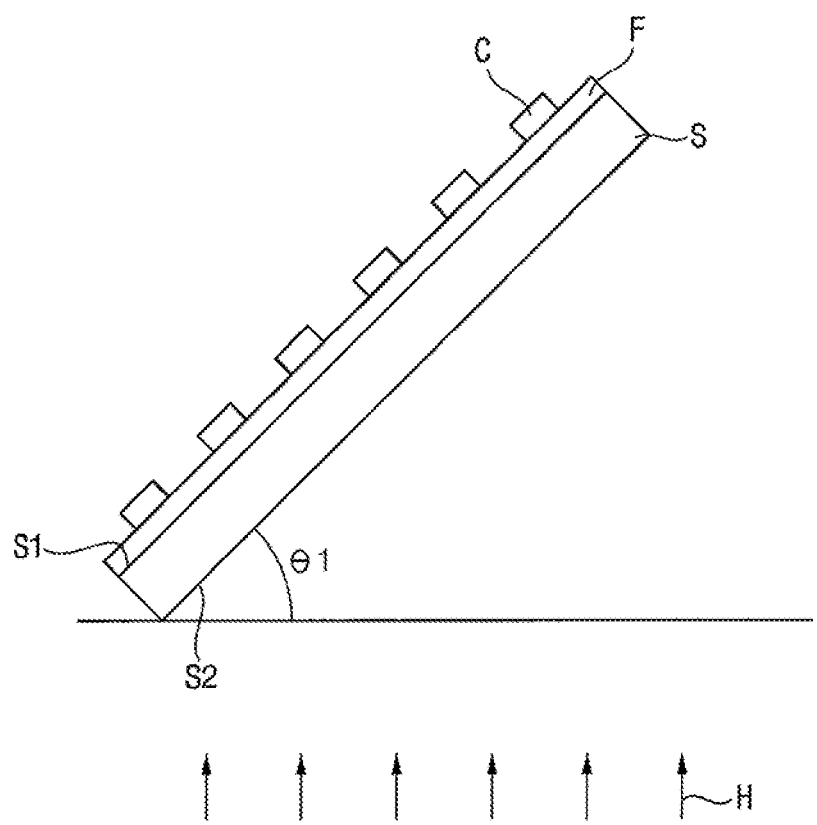
FIG. 12 is a cross-sectional view illustrating a package substrate rotated by an actuator at an acute angle.

FIG. 11 is a flow chart illustrating a method of manufacturing a semiconductor package using the apparatus in FIG. 1 according to an example embodiment, and FIG. 12 is a cross-sectional view illustrating a package substrate S rotated by an actuator at an acute angle θ1.

Referring to FIGS. 1 and 11, in operation ST300, the reference package substrate RS may be cured using the apparatus 100 in FIG. 1.

After the curing process, as shown in FIG. 9, the reference package substrate RS may be upwardly bent with respect to the diagonal axis of the reference package substrate RS.

In operation ST310, the controller 150 may obtain the information of the upward warpage of the reference package substrate RS with respect to the diagonal axis. The information may then be stored in the controller 150.

In operation ST320, as shown in FIG. 12, the first actuator 140 may rotate the package substrate S, which may have a structure substantially the same as that of the reference package substrate RS, at an acute angle θ1, e.g., relative to horizontal, based on the information in the controller 150 with respect to the warpage of the reference package substrate RS. Thus, the slanted second surface S2 of the package substrate S may be downwardly oriented and the slanted first surface S1 of the package substrate S may be upwardly oriented.

In operation ST330, the loader 120 may load the package substrate S rotated at the acute angle θ1 into the curing chamber 110.

In operation ST340, the heater 112 may apply the heat to the slanted second surface S2 of the package substrate S to cure the DAF F. In the curing process, the upward deflection of the package substrate S rotated at the acute angle θ1 may be suppressed to correct the warpage of the package substrate S with respect to the diagonal axis.

In operation ST350, after the DAF F is cured, the unloader 130 may unload the package substrate S from the curing chamber 110. The unloaded package substrate S may be in the rotated state at the acute angle by the first actuator 140.

In operation ST360, the second actuator 160 may reversely rotate the package substrate at the acute angle θ1 to return the package substrate S to the original position.

In another implementation, the method of an example embodiment may use the apparatus 100a in FIG. 6 or the apparatus 100b in FIG. 7.

Figure 13:
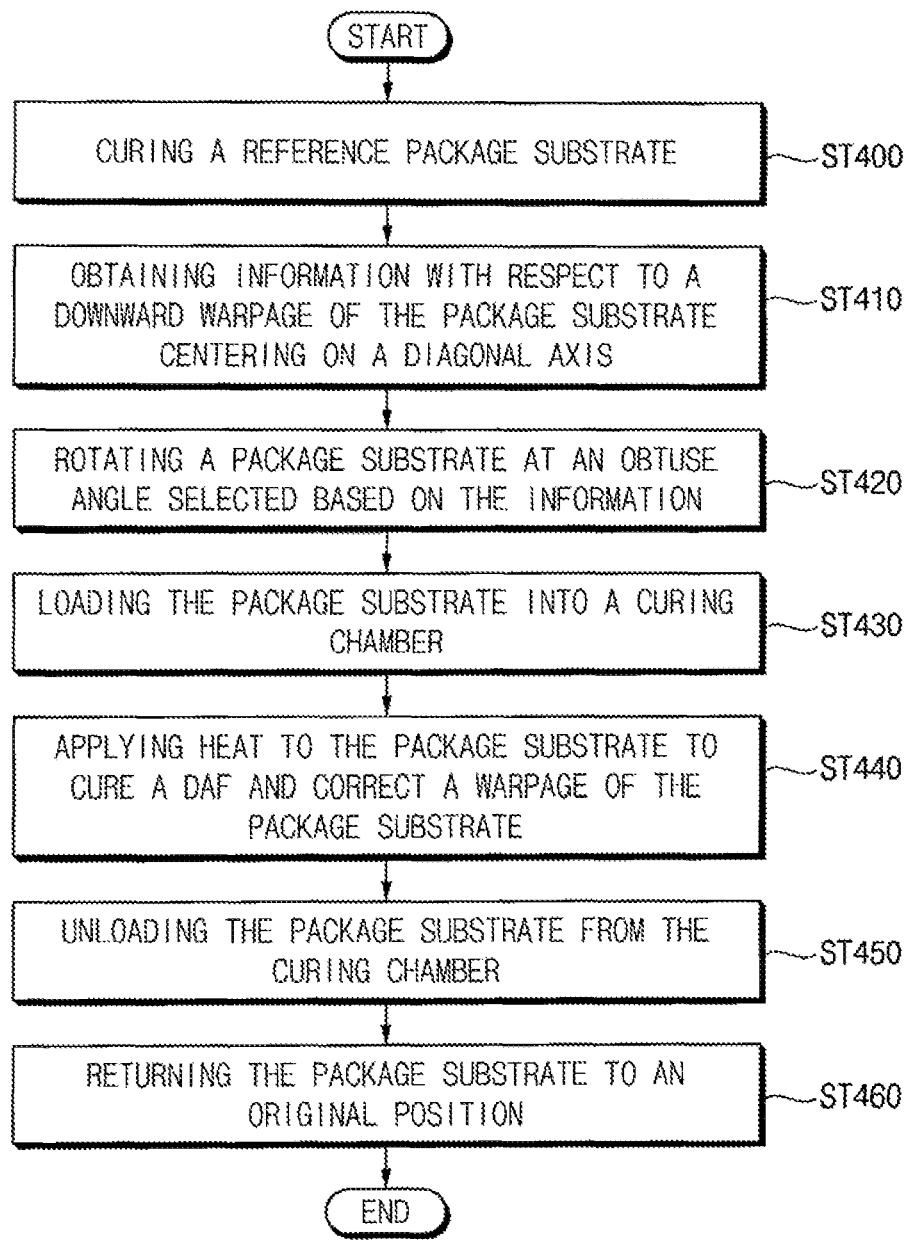
FIG. 13 is a flow chart illustrating a method of manufacturing a semiconductor package using the apparatus in FIG. 1 according to an example embodiment.
Figure 14:
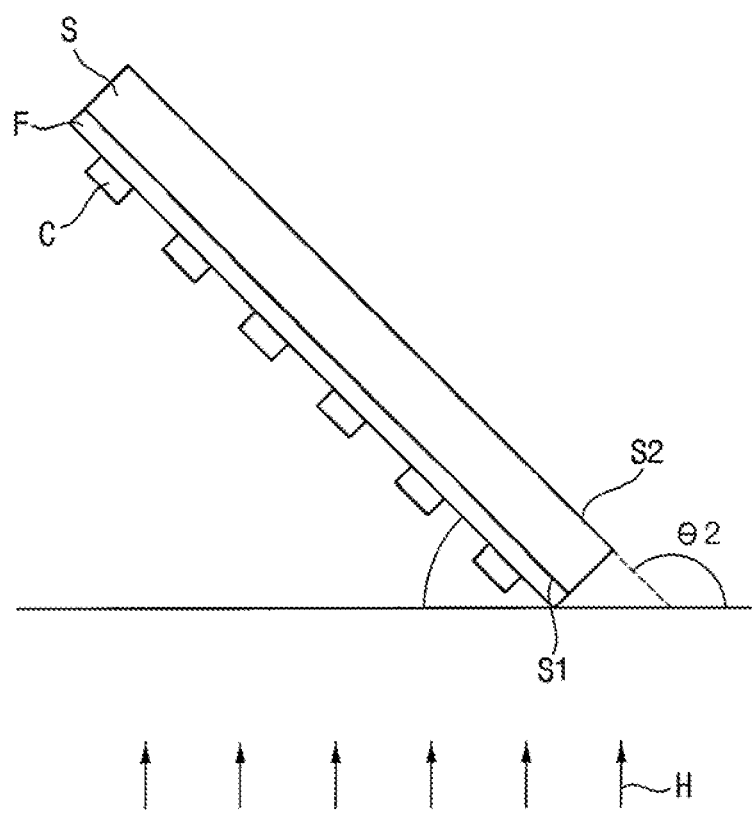
FIG. 14 is a cross-sectional view illustrating a package substrate rotated by an actuator at an obtuse angle.

FIG. 13 is a flow chart illustrating a method of manufacturing a semiconductor package using the apparatus in FIG. 1 according to an example embodiment, and FIG. 14 is a cross-sectional view illustrating a package substrate rotated by an actuator at an obtuse angle θ2.

Referring to FIGS. 1 and 13, in operation ST400, the reference package substrate RS may be cured using the apparatus 100 in FIG. 1.

After the curing process, as shown in FIG. 9, the reference package substrate RS may be downwardly bent with respect to the diagonal axis of the reference package substrate RS.

In operation ST410, the controller 150 may obtain the information of the downward warpage of the reference package substrate RS with respect to the diagonal axis. The information may then be stored in the controller 150.

In operation ST420, as shown in FIG. 14, the first actuator 140 may rotate the package substrate S at an obtuse angle θ2, which may have a structure substantially the same as that of the reference package substrate RS, based on the information in the controller 150 with respect to the warpage of the reference package substrate RS. Thus, the slanted first surface S1 of the package substrate S may be downwardly oriented and the slanted second surface S2 of the package substrate S may be upwardly oriented.

In operation ST340, the loader 120 may load the package substrate S rotated at the obtuse angle θ2 into the curing chamber 110.

In operation ST440, the heater 112 may apply the heat to the slanted first surface S1 of the package substrate S to cure the DAF F. In the curing process, the downward deflection of the package substrate S rotated at the obtuse angle θ2 may be suppressed to correct the warpage of the package substrate S with respect to the diagonal axis.

In operation ST450, after the DAF F is cured, the unloader 130 may unload the package substrate S from the curing chamber 110. The unloaded package substrate S may be in the rotated state at the obtuse angle θ2 by the first actuator 140.

In operation ST460, the second actuator 160 may reversely rotate the package substrate at the acute angle θ2 to return the package substrate S to the original position.

In another implementation, the method of an example embodiment may use the apparatus 100*a* in FIG. 6 or the apparatus 100*b* in FIG. 7.

Figure 15:
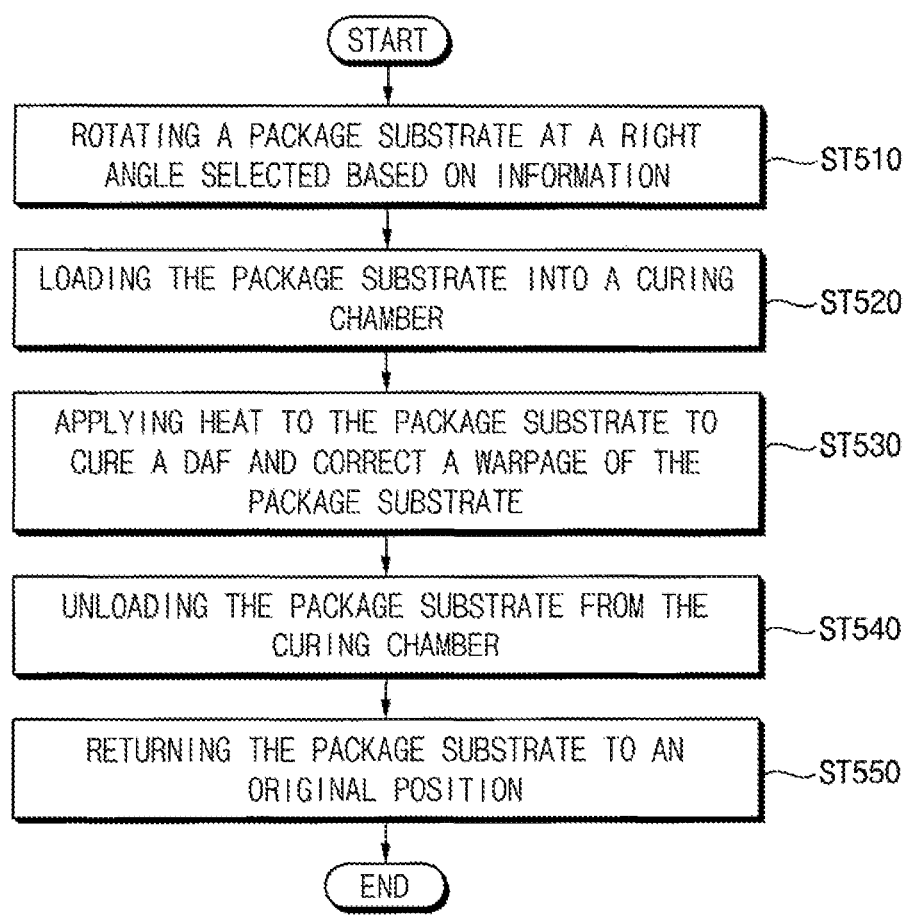
FIG. 15 is a flow chart illustrating a method of manufacturing a semiconductor package using the apparatus in FIG. 1 according to an example embodiment.
Figure 16:
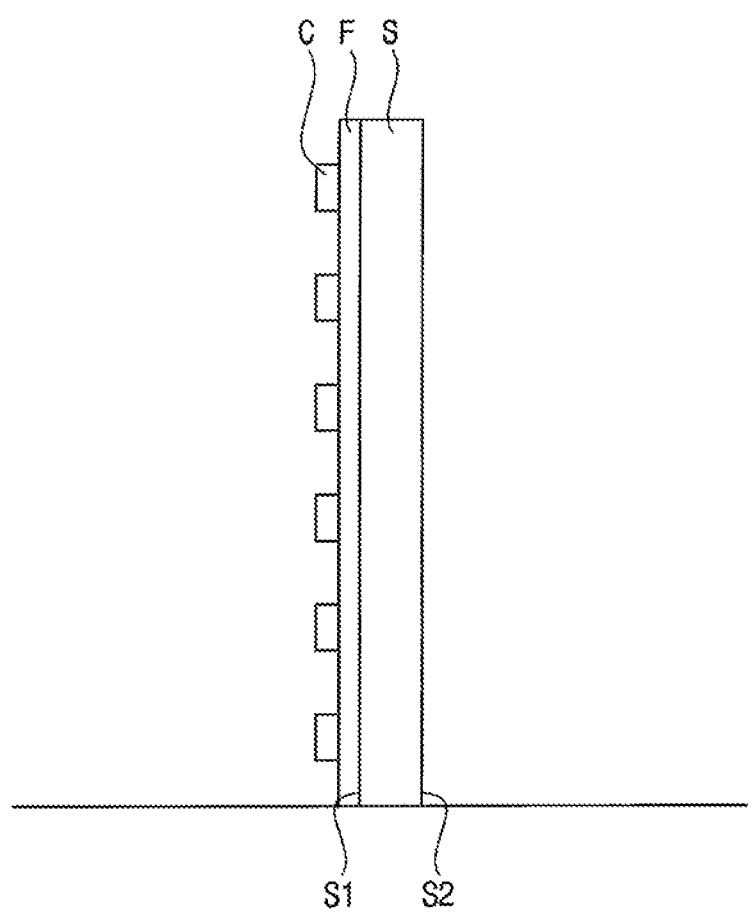
FIG. 16 is a cross-sectional view illustrating a package substrate rotated by an actuator at a right angle.

FIG. 15 is a flow chart illustrating a method of manufacturing a semiconductor package using the apparatus in FIG. 1 according to an example embodiment, and FIG. 16 is a cross-sectional view illustrating a package substrate rotated by an actuator at a right angle.

Referring to FIGS. 1 and 15, in operation ST500, the first actuator 140 may rotate the package substrate S at an angle of about 90° based on the information of the reference package substrate RS. Thus, the first surface S1 and the second surface S2 of the package substrate S may be substantially parallel to the applying direction H of the heat.

In operation ST510, the loader 120 may load the package substrate S rotated at the angle of about 90° into the curing chamber 110.

In operation ST520, the heater 112 may apply the heat to the package substrate S to cure the DAF F. In the curing process, the heat may not be directly applied to the first surface S1 and the second surface S2 of the package substrate S parallel to the applying direction H of the heat. Thus, the downward deflection of the package substrate S rotated at the angle of about 90° may be suppressed so that the warpage of the package substrate S may also be suppressed.

In operation ST530, after the DAF F is cured, the unloader 130 may unload the package substrate S from the curing chamber 110. The unloaded package substrate S may be in the rotated state at the angle of about 90° by the first actuator 140.

In operation ST540, the second actuator 160 may reversely rotate the package substrate at the angle of about 90° to return the package substrate S to the original position.

In another implementation, the method of an example embodiment may use the apparatus 100*a* in FIG. 6 or the apparatus 100*b* in FIG. 7.

By way of summation and review, a general process for curing the DAF may include a process for providing the package substrate with heat. After the curing process, the heat may cause a warpage of the package substrate. Further, the package substrate may be bent in the process for attaching the semiconductor chips to the package substrate using the DAF.

As described above, embodiments relate to a method of curing a die attach film configured to attach a plurality of semiconductor chips to a package substrate, and an apparatus for performing the method.

Embodiments may provide a method of manufacturing a semiconductor package that may be capable of correcting a warpage of a package substrate in a curing process, and an apparatus for performing the method.

According to an example embodiment, a package substrate may be rotated at an angle selected based on the information of a warpage, generated in the curing process of the DAF, of a reference package substrate. Heat may be applied to the rotated package substrate to cure the DAF while correcting for, e.g., preventing, warpage of the package substrate in the curing process.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a semiconductor package, the method comprising:
    obtaining first warpage information with respect to a first downward warpage of a reference package substrate centering on a long axis and/or a short axis of the reference package substrate in a curing process of applying heat to the reference package substrate to cure a first die attach film thereon, wherein the reference package substrate has a first plurality of semiconductor chips attached to the reference package substrate using the first die attach film;
    rotating a package substrate, which includes a first surface and a second surface opposite to the first surface, with respect to a long axis and/or a short axis of the package substrate at an angle of about 180° selected based on the first warpage information, wherein the package substrate has a second plurality of semiconductor chips attached to the package substrate using a second die attach film, the second plurality of semiconductor chips and the second die attach film being on the first surface of the package substrate; and
    applying heat to the package substrate to cure the second die attach film while correcting for a warpage of the package substrate.

2. The method as claimed in claim 1, further comprising obtaining second warpage information with respect to a second downward warpage of the reference package substrate centering on the long axis and/or the short axis in an attaching process to attach the first plurality of semiconductor chips to the reference package substrate,
    wherein the rotating of the package substrate includes rotating the package substrate at the angle of about 180° selected based on the first warpage information obtained in the curing process and the second warpage information obtained in the attaching process.

3. A method of manufacturing a semiconductor package, the method comprising:
    obtaining first warpage information with respect to a warpage of a reference package substrate in a curing process of applying heat to the reference package substrate to cure a first die attach film thereon, wherein the reference package substrate has a first plurality of semiconductor chips attached to the reference package substrate using the first die attach film;
    rotating a package substrate, which includes a first surface and a second surface opposite to the first surface, at an angle selected based on the first warpage information, wherein the package substrate has a second plurality of semiconductor chips attached to the package substrate using a second die attach film, the second plurality of semiconductor chips and the second die attach film being on the first surface of the package substrate; and
    applying the heat to the package substrate to cure the second die attach film while correcting for a warpage of the package substrate.

4. The method as claimed in claim 3, wherein the first warpage information includes information with respect to a downward warpage of the reference package substrate centering on a long axis and/or a short axis of the reference package substrate.

5. The method as claimed in claim 4, wherein the rotating of the package substrate includes rotating the package substrate on a long axis or a short axis at an angle of about 180° selected based on the information with respect to the downward warpage of the reference package substrate.

6. The method as claimed in claim 5, wherein the applying of heat to the package substrate includes applying the heat to the first surface of the package substrate.

7. The method as claimed in claim 3, wherein the first warpage information includes information with respect to a warpage of the reference package substrate centering on a diagonal axis of the reference package substrate.

8. The method as claimed in claim 7, wherein the information with respect to the warpage of the reference package substrate centering on the diagonal axis includes information with respect to an upward warpage of the reference package substrate centering on the diagonal axis.

9. The method as claimed in claim 8, wherein the rotating of the package substrate includes rotating the package substrate on a long axis or a short axis at an acute angle selected based on the information with respect to the upward warpage of the reference package substrate centering on the diagonal axis.

10. The method as claimed in claim 9, wherein the applying of heat to the package substrate includes applying the heat to the second surface of the package substrate.

11. The method as claimed in claim 7, wherein the information with respect to the warpage of the reference package substrate centering on the diagonal axis includes information with respect to a downward warpage of the reference package substrate centering on the diagonal axis.

12. The method as claimed in claim 11, wherein the rotating of the package substrate includes rotating the package substrate on a long axis or a short axis at an obtuse angle selected based on the information with respect to the downward warpage of the reference package substrate centering on the diagonal axis.

13. The method as claimed in claim 12, wherein the applying of heat to the package substrate includes applying the heat to the first surface of the package substrate.

14. The method as claimed in claim 3, wherein the rotating of the package substrate includes rotating the package substrate at a right angle substantially parallel to an applying direction of the heat.

15. The method as claimed in claim 3, further comprising obtaining second warpage information with respect to a downward warpage of the reference package substrate centering on a long axis and/or a short axis of the reference package substrate in an attaching process to attach the first plurality of semiconductor chips to the reference package substrate, wherein the rotating of the package substrate includes rotating the package substrate at an angle selected based on the first warpage information obtained in the curing process and the second warpage information obtained in the attaching process.

* * * * *